US006686322B1

United States Patent
Nohara et al.

(10) Patent No.: US 6,686,322 B1
(45) Date of Patent: Feb. 3, 2004

(54) CLEANING AGENT AND CLEANING PROCESS USING THE SAME

(75) Inventors: Masahiro Nohara, Osaka (JP); Ryou Hashimoto, Osaka (JP); Taimi Oketani, Osaka (JP); Hisaki Abe, Niigata-ken (JP); Taketo Maruyama, Niigata-ken (JP); Tetsuo Aoyama, Niigata-ken (JP)

(73) Assignees: Sharp Kabushiki Kaisha, Osaka (JP); Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/581,118

(22) PCT Filed: Nov. 11, 1999

(86) PCT No.: PCT/JP99/06291
§ 371 (c)(1), (2), (4) Date: Aug. 28, 2000

(87) PCT Pub. No.: WO00/30162
PCT Pub. Date: May 25, 2000

(30) Foreign Application Priority Data

Nov. 12, 1998 (JP) ............................................. 10-322413
Dec. 3, 1998 (JP) ............................................. 10-344652

(51) Int. Cl.[7] ............................... C11D 9/42; C11D 7/18
(52) U.S. Cl. ...................... 510/175; 510/176; 438/695; 134/2; 134/3
(58) Field of Search ........................... 134/2, 3, 26, 38, 134/40; 252/186.29, 79.4; 510/175, 176; 438/695

(56) References Cited

U.S. PATENT DOCUMENTS

| 4,889,689 A | * | 12/1989 | Tsao |
| 5,110,765 A | * | 5/1992 | Bilakanti et al. |
| 5,290,361 A | * | 3/1994 | Hayashida et al. |
| 5,302,311 A | * | 4/1994 | Sugihara et al. |
| 5,705,089 A | * | 1/1998 | Sugihara et al. |
| 5,869,440 A | * | 2/1999 | Kobayashi et al. |

FOREIGN PATENT DOCUMENTS

| DE | 3929335 A | * | 3/1991 |
| JP | 62-49355 | | 3/1987 |
| JP | 64-42653 | | 2/1989 |
| JP | 05013421 | * | 1/1993 |
| JP | 05127143 | * | 5/1993 |
| JP | 7-201794 | | 8/1995 |
| JP | 8-202052 | | 8/1996 |

* cited by examiner

Primary Examiner—Gregory E. Webb
(74) Attorney, Agent, or Firm—Antonelli, Terry, Stout & Kraus, LLP

(57) ABSTRACT

A cleaning agent which comprises 0.1 to 60% by weight of an oxidizing agent and 0.0001 to 5% by weight of a chelating agent. In the process for producing semiconductor integrated circuits, a pattern layer of a photoresist used as an etching mask and residues formed from the photoresist by dry etching can be easily removed with the cleaning agent. In the process for producing substrates for liquid crystal display panels, residues derived from a conductive thin film formed by dry etching can also be easily removed. In the cleaning processes using the cleaning agent, wiring materials or insulating materials in thin film circuit devices or other materials used for producing substrates of semiconductor integrated circuits and liquid crystal panels are not corroded.

7 Claims, 2 Drawing Sheets

CLEANING AGENT AND CLEANING PROCESS USING THE SAME

TECHNICAL FIELD

The present invention relates to a cleaning agent which comprises an oxidizing agent and a chelating agent and to a process for producing semiconductor devices and substrates for liquid crystal display panels using said cleaning agent.

More particularly, the present invention relates to a cleaning process which comprises removing a layer of a photoresist and residues formed from a photoresist in the process for producing semiconductor integrated circuits, a process for cleaning glass substrates for liquid crystal display panels in the process for producing substrates for liquid crystal display panels and a cleaning process which comprises removing residues formed by dry etching in the production of thin film circuit devices made of materials such as tantalum, aluminum, chromium, niobium and indiumtin oxide (referred to as ITO, hereinafter) which are used for producing substrates for liquid crystal display panels.

BACKGROUND ART

Lithography has generally been used in the production of semiconductor devices such as IC and LSI and substrates for liquid crystal display panels. When semiconductor devices and substrates for liquid crystal display panels are produced in accordance with the lithography, in general, the following series of procedures are conducted: an insulation film such as a film of silicon oxide and a conductive thin film for conductive wirings such as a metal film are formed on a silicon wafer or a substrate made of a material such as glass; the thus formed films are uniformly coated with a photoresist and a photosensitive layer is formed on the films; the photosensitive layer is treated by selective exposure to light and development and a desired pattern of the photoresist is formed; using the formed pattern of the photoresist as a mask, the films of the lower layers are selectively etched and a pattern is formed; and then the pattern of the photoresist is completely removed. In recent years, semiconductors and substrates for liquid crystal display panels are integrated to greater degrees and formation of patterns having dimensions of a quarter micron or smaller are required. As the dimension of working becomes extremely small, dry etching is mainly used for the selective etching and ashing with oxygen plasma is used for the removal of the pattern of the photoresist.

However, in the dry etching, it is known that residues derived from the dry etching gas, the photoresist and the conductive thin film (referred to as resist residues, hereinafter) are formed in portions around the formed pattern. When the resist residues are present in portions around the pattern, in particular, inside and around via holes, undesirable phenomena such as an increase in resistance and short circuits arise. Therefore, to obtain semiconductor devices and substrates for liquid crystal display panels having high qualities, removal of the resist residues is very important.

Moreover, as the surface area of glass substrates for liquid crystals which are used for liquid crystal panels becomes greater, display devices tend to have a greater number of pixels. Under such circumstances, the degree of cleaning of the entire surface of glass substrates for liquid crystals is directly related to the yield of the production and, as the result, improvement in the cleaning ability is strongly desired.

As the cleaning agent for glass substrates for liquid crystals, alkali cleaning agents such as inorganic alkalis and organic alkalis and acid cleaning agents such as sulfuric acid, hydrofluoric acid and buffered hydrofluoric acid are currently used. However, the cleaning agents using inorganic alkalis have a problem in that alkali ions are adsorbed to the substrates and remain there after the cleaning and the residual alkali ions occasionally cause problems on electric properties of the substrates, in particular, the substrates of thin film transistors (TFT). The cleaning agents using organic alkalis have a problem in that a sufficient effect of cleaning cannot be obtained and adhesion of thin films formed in the succeeding steps occasionally becomes poor. Moreover, when the cleaning is conducted using a conventional cleaning agent, minute roughness of the surface of glass substrates as damages formed by the etching and minute particles also formed by the etching are not completely removed. These problems are becoming crucial as the liquid crystals are more highly integrated and the surface area of the glass substrates increases. It is strongly desired that an effective method to overcome these problems is developed.

As the process for removing resist residues, cleaning liquids of organic amine which comprise mixtures of alkanolamines and organic solvents are disclosed in Japanese Patent Application Laid-Open Nos. Showa 62(1987)-49355 and Showa 64(1989)-42653. These cleaning liquids have drawbacks in that the cleaning liquids are flammable because relatively high temperatures are required for the treatment and flammable organic compounds in the cleaning liquids are vaporized and that metal films are corroded because the organic amines are alkaline when rinsing is conducted with water alone without an organic solvent such as an alcohol after the removal of resist residues and, therefore, rinsing with an organic solvent such as an alcohol is necessary. Aqueous solutions of fluorine comprising fluorine compounds, organic solvents and corrosion inhibitors which exhibit greater ability to remove resist residues than the cleaning liquids of organic amines do and can be used at lower temperatures are disclosed in Japanese Patent Application Laid-Open Nos. Heisei 7(1995)-201794 and Heisei 8(1996)-20205.

In recent years, the conditions are becoming harder in treatments such as dry etching and ashing in the process for producing semiconductor devices and substrates for liquid crystal display panels. Photoresists have greater transformation due to this change in the conditions and complete removal of resist residues cannot be achieved by using the above cleaning liquids of alkalis or the above aqueous solutions of fluorine. When the resist residues are not removed completely and left remaining, electrical troubles such as an increase in resistance, breaking of wirings, short circuits and disorder in wirings arise. Therefore, a cleaning agent which can achieve complete removal of resist residues is strongly desired.

Moreover, when the cleaning liquids of organic amines are used, residues containing tantalum left after dry etching are hardly removed. To remove the residues containing tantalum completely, a cleaning agent containing fluorine such as buffered hydrofluoric acid is used after the dry etching. However, the cleaning agent containing fluorine has a problem in that materials of switching devices such as amorphous silicon and polysilicon and glass substrates are corroded.

DISCLOSURE OF THE INVENTION

An object of the present invention is to provide a cleaning agent which can effectively remove resist residues formed in the process for producing semiconductor devices and residues derived from conductive thin films of metals formed, photoresist films used as the etching mask and contaminants on glass substrates in the process for producing substrates for liquid crystal display panels.

Another object of the present invention is to provide a cleaning process in which a photoresist forming a mask on inorganic or plastic substrates and resist residues remaining after dry etching can be removed in a short time in the wiring process of semiconductors used in semiconductor integrated circuits while no wiring materials or insulating materials are corroded.

Still another object of the present invention is to provide a process for cleaning glass substrates for liquid crystals which are used in the process for producing liquid crystal display panels.

Still another object of the present invention is to provide a cleaning process in which residues formed by dry etching for formation of thin circuits on glass substrates are removed easily while the glass substrates, the thin film circuit devices or the wiring materials are not corroded at all and substrates for liquid crystal display panels can be cleaned very efficiently.

As the result of intensive studies by the present inventors to achieve the above objects, a cleaning agent which comprises an oxidizing agent and a chelating agent and a process for cleaning using this cleaning agent were discovered. The present invention has been completed based on the knowledge.

As the first embodiment of the present invention, a cleaning agent comprises 0.1 to 60% by weight of an oxidizing agent and 0.0001 to 5% by weight of a chelating agent.

As the second embodiment of the present invention, a process for cleaning semiconductor devices comprises coating an inorganic or plastic substrate with a photoresist film, forming a mask with the photoresist film, dry etching portions of the substrate which are not covered with the mask and removing residues of the photoresist formed by the dry etching and/or the photoresist film forming the mask with a cleaning agent described above. In the above process, where desired, ashing may be conducted after the dry etching and resist residues formed by the dry etching may be removed with the above cleaning agent thereafter.

As the third embodiment of the present invention, a process for cleaning substrates for liquid crystal display panels comprises forming a conductive thin film on a glass substrate; forming a prescribed pattern with a photoresist on the conductive thin film; using the pattern of the photoresist as an etching mask, removing portions of the conductive film which are not covered with the pattern of the photoresist by dry etching; and removing residues derived from the conductive thin film which are formed by the dry etching with a cleaning agent described above. In the above process, where desired, ashing may be conducted after the dry etching and residues may be removed with the above cleaning agent thereafter.

THE MOST PREFERRED EMBODIMENT TO CARRY OUT THE INVENTION

Figure 1:
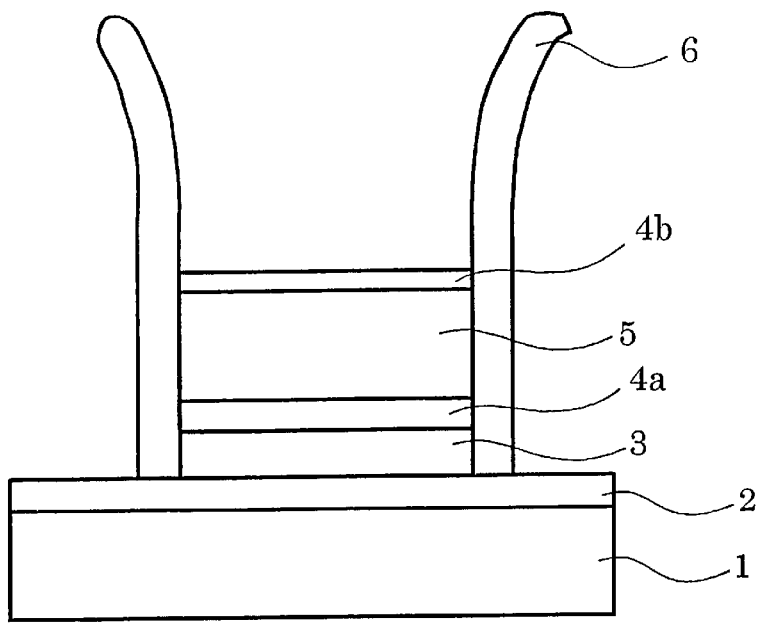
FIG. 1 shows a sectional view of a circuit device of an aluminum alloy used in Examples and Comparative Examples which had been treated by etching, followed by ashing.

The cleaning agent of the present invention comprises an oxidizing agent and a chelating agent and preferably an aqueous solution containing an oxidizing agent and a chelating agent.

Examples of the oxidizing agent include inorganic peroxides such as hydrogen peroxide, ozone and perchloric acid and organic peroxides such as benzoyl peroxide. Among these oxidizing agents, inorganic peroxides are preferable and hydrogen peroxide is more preferable. The oxidizing agent may also be used as a solution in an organic solvent. The concentration of the oxidizing agent used in the present invention is 0.1 to 60% by weight and preferably 0.5 to 30% by weight of the entire cleaning agent. When the concentration is smaller than 0.1% by weight, the desired cleaning effect cannot be obtained. When the concentration exceeds 60% by weight, there is the possibility that wiring materials such as conductive thin film materials are corroded.

Examples of the chelating agent used in the present invention include aminopolycarboxylic acids such as ethylenediaminetetraacetic acid (EDTA), hydroxyethylethylenediaminetriacetic acid (HEDTA), dihydroxyethylethylenediaminetetraacetic acid (DHEDTA), 1,3-propanediaminetetraacetic acid (1,3-PDTA), diethylenetriaminepentaacetic acid (DTPA), triethylenetetraminehexaacetic acid (TTNA), nitrilotriacetic acid (NTA) and hydroxyethyliminodiacetic acid (HIMDA); and ammonium salts, metal salts and organic alkali salts of these compounds.

Further examples of the chelating agent include chelating agents of phosphonic acids which have one or more phosphonic acid groups in the molecule such as methyldiphosphonic acid, aminotrismethylenephosphonic acid, ethylidenediphosphonic acid, 1-hydroxyethylidene-1,1-diphosphonic acid, 1-hydroxypropylidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexanediaminetetrakismethylenephosphonic acid, diethylenetriaminepentamethylenephosphonic acid and 1,2-propanediaminetetramethylenephosphonic acid; and oxides, ammonium salts, organic amine salts and alkali metal salts of these chelating agents. The oxides of the chelating agents of phosphonic acids are compounds obtained by oxidation of a nitrogen atom in the molecule of the chelating agents to form an N-oxide.

Still further examples of the chelating agent include condensed phosphoric acids such as metaphosphoric acid, tetrametaphosphoric acid, hexametaphosphoric acid and tripolyphosphoric acid; and ammonium salts, metal salts and organic amine salts of the condensed phosphoric acids.

Any of the above chelating agents may be used as the chelating agent. The chelating agents of phosphonic acids which have two or more phosphonic groups in the molecule are preferable and chelating agents of phosphonic acids which have 2 to 6 phosphonic acid groups in the molecule are more preferable. Specifically, 1,2-propanediaminetetramethylenephosphonic acid, diethylenetriaminepentamethylenephosphonic acid and ethylenediaminetetrakismethylenephosphonic acid are preferable and 1,2-propanediaminetetramethylenephosphonic acid is more preferable.

The above chelating agent may be used singly or in a suitable combination of two or more.

The concentration of the chelating agent is not particularly limited. The concentration is generally 0.0001 to 5% by weight of the entire amount of the cleaning agent. From the standpoint of the cleaning effect and economy, the concentration is preferably 0.01 to 3% by weight. When the concentration is smaller than 0.0001% by weight, the desired cleaning effect cannot be obtained. When the concentration exceeds 5% by weight, there is the possibility that conductive thin film materials are corroded.

pH of the cleaning agent of the present invention is not particularly limited. In general, the cleaning agent is used at a pH in the range of 3 to 12. pH can be suitably selected in accordance with the etching conditions and the type of the used inorganic substrate. When the cleaning agent is used in an alkaline condition, ammonia, an amine or a quaternary ammonium hydroxide such as tetramethylammonium hydroxide may be added. When the cleaning agent is used in an acidic condition, an organic acid or an inorganic acid may be added.

To improve the wetting property of the cleaning agent of the present invention, a surfactant may be added without any problems. Any of cationic surfactants, nonionic surfactants and anionic surfactants may be added in an amount such that the effect of the present invention is not adversely affected. Among these surfactants, surfactants of sulfonic acids, surfactants of polycarboxylic acids and surfactants of ethylene oxide adducts are preferable.

The temperature in the cleaning process of the present invention is generally in the range of the ordinary temperature to 80° C. The temperature may be suitably selected in accordance with the etching conditions and the type of the material of the used substrate.

Examples of the material of the inorganic substrate used in the cleaning process of the present invention include silicon materials such as silicon, amorphous silicon, polysilicon, silicon oxide and silicon nitride; materials of insulating thin films and conductive thin films such as aluminum, aluminum alloys, titanium, titanium alloys, titanium nitride, tungsten, tungsten alloys, tantalum, tantalum oxides, tantalum alloys, chromium, chromium oxides, chromium alloys, niobium, niobium alloys and ITO (indium-tin oxide); and compound semiconductors such as gallium-arsenic, gallium-phosphorus and indium-phosphorus. Examples of the material of the plastic substrate include epoxy resins, acrylic resins, polyester resins, polyether sulfone resins, polyacrylate resins, polyetherimide resins, polyarylate resins, polyimide resins and polycarbonate resins.

In the process for cleaning semiconductor devices of the present invention, a prescribed pattern is formed with a photoresist on an inorganic substrate; portions of the above conductive thin film which are not masked by the photoresist are removed by dry etching; and residues formed by the dry etching are removed with the above cleaning agent. After the dry etching, ashing may be conducted, where desired, and subsequently residues formed by the dry etching may be removed with the above cleaning agent.

In the process for cleaning substrates for liquid crystal display panels of the present invention, a prescribed pattern is formed with a photoresist on a glass substrate; portions of the above conductive thin film which are not masked by the photoresist are removed by dry etching; and residues formed by the dry etching are removed with the above cleaning agent. After the dry etching, ashing may be conducted, where desired, and subsequently residues formed by the dry etching may be removed with the above cleaning agent.

In the ashing described above, a photoresist made of an organic macromolecule, for example, is removed as CO and $CO_2$ by the burning reaction with oxygen plasma which is generated in a plasma. Specific procedures are as follows: a substrate for the treatment and an ashing gas is sealed into a container which is disposed between a pair of electrodes; a high frequency electric power is applied to the electrodes; a plasma of the ashing gas is generated in the container; active ions in the generated plasma are reacted with the substance at the surface of the substrate; and the photoresist is vaporized and removed.

It is not necessary that an organic solvent such as an alcohol is used for rinsing after the cleaning agent of the present invention has been used. Rinsing with water is sufficient.

The present invention also provides a process for cleaning glass substrates themselves with the cleaning agent comprising an oxidizing agent and a chelating agent. The glass substrates cleaned in accordance with this process are advantageously used as the substrates for various liquid crystal display panels. In the process for cleaning substrates for liquid crystal display panels of the present invention, substrates which have been cleaned in advance in accordance with the above process for cleaning glass substrates may be used.

The present invention will be described more specifically with reference to Examples and Comparative Examples in the following. However, the present invention is not limited to Examples and Comparative Examples.

EXAMPLE 1

(1) Preparation of a Cleaning Agent

A cleaning agent was prepared by adding 50 g of a high purity hydrogen peroxide as the oxidizing agent and 2 g of 1,2-propanediaminetetramethylenephosphonic acid as the chelating agent to 948 g of ultra-pure water, followed by mixing the resultant mixture to prepare a homogeneous solution.

(2) Removal of Resist Residues

On a silicon substrate, an oxide film, a barrier metal film of titanium, a barrier metal film of titanium nitride, a conductive thin film of an aluminum alloy (Al—Cu) and a barrier metal film of titanium nitride were successively formed and the resultant laminate was coated with a photoresist. A pattern was formed with the photoresist in accordance with the lithography. Dry etching with a gas containing fluorine was conducted using the formed pattern of the photoresist as the mask. Subsequently, ashing with oxygen plasma was conducted. The sectional view of the obtained aluminum alloy circuit device is shown in FIG. 1. In FIG. 1, the oxide film 2, the barrier metal film of titanium 3, the barrier metal film of titanium nitride 4a, the conductive thin film of an aluminum alloy 5 and the barrier metal film of titanium nitride 4b were successively formed on the silicon substrate 1. On the side walls of these films, resist residues 6 remained.

Thereafter, the aluminum alloy circuit device was dipped into the cleaning agent prepared above in (1) at 50° C. for 5 minutes, rinsed with ultra-pure water and dried. The surface of the dried device was examined by the scanning electron microscope (SEM) observation with respect to the removal of the resist residues and the corrosion of the conductive thin film of an aluminum alloy and the results of the examination were evaluated in accordance with the following criteria. It was found that the resist residues were completely removed and no corrosion of the aluminum alloy was found at all.

The criteria of the evaluations by the SEM observation are as follows:

| (Removal of resist residues) | |
| --- | --- |
| excellent | completely removed |
| good | almost completely removed |
| fair | a portion remaining |
| poor | most of the resist residues remaining |
| (Corrosion) | |
| excellent | no corrosion at all |
| good | almost no corrosion |
| fair | corrosion in a crater shape or a pit shape |
| poor | rough surfaces on the entire face of the conductive thin film of an aluminum alloy; depression of the surface of the conductive thin film of an aluminum alloy |

EXAMPLES 2 to 9

Aluminum alloy circuit devices were prepared in accordance with the same procedures as those conducted in Example 1. The prepared devices were dipped into cleaning agents having the compositions shown in Table 1 in the conditions shown in Table 1, rinsed with ultra-pure water and dried. The surface of the devices was examined by the SEM observation with respect to the removal of the resist residues remaining at the sides of the films and the corrosion of the surface of the conductive thin film of an aluminum alloy and the results of the examination were evaluated. The results of the evaluation are shown in Table 1.

COMPARATIVE EXAMPLES 1 to 5

The devices prepared in accordance with the same procedures as those described above were dipped into cleaning agents having the compositions shown in Table 1 in the conditions shown in Table 1, rinsed with ultra-pure water and dried. The surface of the devices was examined by the SEM observation with respect to the removal of the resist residues remaining at the sides of the films and the corrosion of the surface of the conductive thin film of an aluminum alloy and the results of the examination were evaluated in according to the above criteria in the same manner as that in Examples. The results of the evaluation are shown in Table 1.

TABLE 1

| | Composition of cleaning agent | | | Condition of cleaning | | Evaluation | |
| --- | --- | --- | --- | --- | --- | --- | --- |
| | oxidizing agent (% by wt.) | chelating agent (% by wt.) | water (% by wt.) | temperature (° C.) | time (min.) | removal of resist residues | corrosion |
| Example 1 | HP (5) | PDTP (0.2) | 94.8 | 50 | 5 | excellent | excellent |
| Example 2 | HP (10) | PDTP (0.05) | 89.95 | 50 | 5 | excellent | excellent |
| Example 3 | HP (3) | PDTP (1) | 96.0 | 50 | 5 | excellent | excellent |
| Example 4 | HP (5) | DTPP (0.2) | 94.8 | 50 | 5 | excellent | excellent |
| Example 5 | HP (10) | EDTA (1) | 89.0 | 50 | 5 | excellent | excellent |
| Example 6 | HP (5) | EDTP (0.3) | 94.7 | 50 | 5 | excellent | excellent |
| Example 7 | HP (5) | PDTP (0.2) | 94.8 | 30 | 15 | excellent | excellent |
| Example 8 | HP (5) | PDTP (0.2) | 94.8 | 70 | 1 | excellent | excellent |
| Example 9 | HP (0.5) | PDTP (1.5) | 98.0 | 60 | 10 | excellent | excellent |
| Comparative Example 1 | HP (5) | — | 95 | 50 | 5 | fair | excellent |
| Comparative Example 2 | — | PDTP (0.5) | 95.5 | 50 | 5 | poor | excellent |
| Comparative Example 3 | HP (10) | — | 90 | 50 | 5 | fair | excellent |
| Comparative Example 4 | HP (10) | — | 90 | 70 | 20 | good | good |
| Comparative Example 5 | — | EDTA (2) | 98.0 | 50 | 10 | poor | excellent |

HP Hydrogen peroxide
PDTP 1,2-Propanediaminetetramethylenephosphonic acid
DTPP Diethylenetriaminepentamethylenephosphonic acid
EDTA Ethylenediaminetetraacetic acid
EDTP Ethylenediaminetetrakismethylenephosphonic acid

EXAMPLE 10

In accordance with the same procedures as those conducted in Example 1, the same films as those described in Examples 1 including the conductive thin film of an aluminum alloy (Al—Cu) were formed on a silicon substrate. The prepared laminate was coated with a photoresist and a pattern was formed with the photoresist in accordance with the lithography. Dry etching with a gas containing fluorine was conducted using the formed pattern of the photoresist as the mask. Thereafter, the aluminum alloy circuit device having the photoresist forming the mask and resist residues formed by the dry etching was dipped into a cleaning agent having the same composition as that of the cleaning agent used in Example 1 at 50° C. for 5 minutes, rinsed with ultra-pure water and dried. The surface of the dried device was examined by the scanning electron microscope (SEM) observation with respect to the removal of the photoresist forming the mask and the resist residues and the corrosion of the conductive thin film of an aluminum alloy and the results of the examination were evaluated in accordance with the above criteria. It was found that the photoresist forming the mask and the resist residues were completely removed and no corrosion of the conductive thin film of an aluminum alloy was found at all.

EXAMPLE 11

(1) Preparation of a Cleaning Agent

A cleaning agent was prepared by adding 50 g of a high purity hydrogen peroxide as the oxidizing agent and 3 g of 1,2-propanediaminetetramethylenephosphonic acid as the chelating agent to 947 g of ultra-pure water, followed by mixing the resultant mixture to prepare a homogeneous solution.

(2) Cleaning

Figure 2:
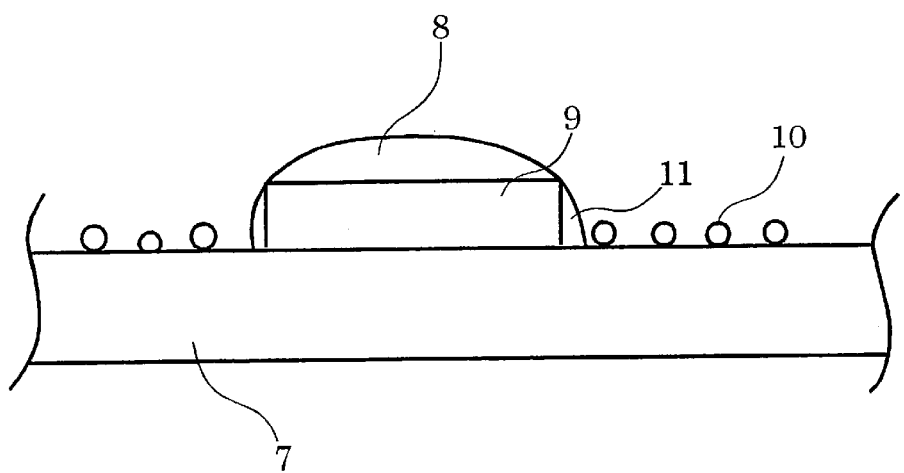
FIG. 2 shows a sectional view of a tantalum thin film circuit device used in Examples and Comparative Examples and having a resist film which had been treated by etching.

A thin film of tantalum was formed on a glass substrate in accordance with the sputtering. The formed film was coated with a photoresist and a pattern was formed with the photoresist in accordance with the lithography. Dry etching with a gas containing fluorine was conducted using the formed pattern of the photoresist as the mask. The sectional view of the obtained tantalum thin film circuit device is shown in FIG. 2. In FIG. 2, the pattern 8 of the photoresist remained on the thin film of tantalum 9 which was formed on the glass substrate 7. On the side walls of the thin film of tantalum, resist residues 11 were formed. Residues of tantalum such as fine particles of tantalum 10 which were formed by dry etching were scattered and remained on the glass substrate 7.

Figure 3:
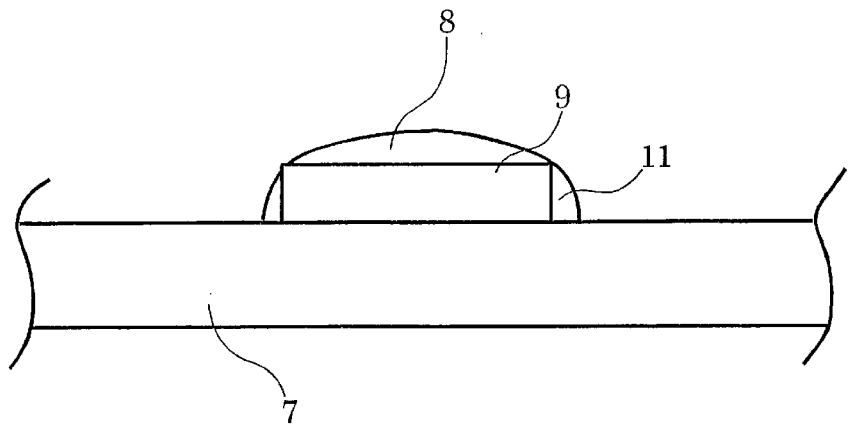
FIG. 3 shows a sectional view of a tantalum thin film circuit device obtained by cleaning the thin film circuit device shown in FIG. 2.

The above tantalum thin film circuit device was dipped into the cleaning agent prepared in (1) described above at 50° C. for 10 minutes, rinsed with ultra-pure water and dried. The sectional view of the tantalum thin film circuit device after being cleaned is shown in FIG. 3.

Then, the surface of the dried device was examined by the scanning electron microscope (SEM) observation with respect to the removal of the fine particles of tantalum and the result of the examination was evaluated in accordance with the following criterion. It was found that the tantalum residues such as the tantalum fine particles were completely removed. The result of the evaluation is shown in Table 2.

The criterion of the evaluation by the SEM observation is as follows:

(Criterion of the Evaluation of the Removal of Residues)

| | |
|---|---|
| excellent | completely removed |
| good | almost completely removed |
| fair | a portion remaining |
| poor | most of the residues remaining |

EXAMPLES 12 TO 16 AND COMPARATIVE EXAMPLE 6 TO 8

Tantalum thin film circuit devices were prepared in accordance with the same procedures as those conducted in Example 11. The prepared tantalum thin film circuit devices were dipped into cleaning agents having the compositions shown in Table 2 in the conditions shown in Table 2, rinsed with ultra-pure water and dried. The surface of the glass substrates 7 of the obtained tantalum thin film circuit devices was examined by the scanning electron microscope (SEM) observation with respect to the removal of the fine particles of tantalum and the results of the examination were evaluated in accordance with the above criterion in the same manner as that in Example 11. The results of the evaluation are shown in Table 2.

TABLE 2

| | Composition of cleaning agent | | | Condition of cleaning | | Removal of fine particles |
|---|---|---|---|---|---|---|
| | oxidizing | chelating | | | | |
| | agent (% by wt.) | agent (% by wt.) | water (% by wt.) | temperature (° C.) | time (min.) | of tantalum |
| Example 11 | HP (5) | PDTP (0.3) | 94.7 | 50 | 10 | excellent |
| Example 12 | HP (5) | DTPP (0.3) | 94.7 | 50 | 10 | excellent |
| Example 13 | HP (5) | EDBP (0.3) | 94.7 | 50 | 10 | excellent |
| Example 14 | HP (5) | EDTA (0.5) | 94.5 | 50 | 15 | excellent |
| Example 15 | HP (10) | PDTP (0.3) | 89.7 | 40 | 10 | excellent |
| Example 16 | HP (3) | PDTP (0.3) | 96.7 | 60 | 10 | excellent |
| Comparative Example 6 | HP (5) | — | 95.0 | 50 | 10 | fair |
| Comparative Example 7 | — | PDTP (0.3) | 99.7 | 50 | 10 | poor |

TABLE 2-continued

| | Composition of cleaning agent | | | Condition of cleaning | | Removal of fine particles |
|---|---|---|---|---|---|---|
| | oxidizing agent (% by wt.) | chelating agent (% by wt.) | water (% by wt.) | temperature (° C.) | time (min.) | of tantalum |
| Comparative Example 8 | — | DTPP (0.3) | 99.7 | 50 | 10 | poor |

HP Hydrogen peroxide
PDTP 1,2-Propanediaminetetramethylenephosphonic acid
DTPP Diethylenetriaminepentamethylenephosphonic acid
EDTA Ethylenediaminetetraacetic acid
EDTP Ethylenediaminetetrakismethylenephosphonic acid
EDBP Ethylenediaminebismethylenephosphonic acid.

COMPARATIVE EXAMPLE 9

A tantalum thin film circuit device which was the same as that prepared in Example 11 was cleaned with a cleaning liquid containing 60% by weight of monoethanolamine and 40% by weight of N-methylpyrrolidone at 80° C. for 10 minutes, rinsed with isopropanol and dried. The dried device was examined by the scanning electron microscope (SEM) observation and it was found that most of the fine particles of tantalum shown in FIG. 2 were left remaining.

EXAMPLES 17 TO 22 AND COMPARATIVE EXAMPLE 10 TO 12

Figure 4:
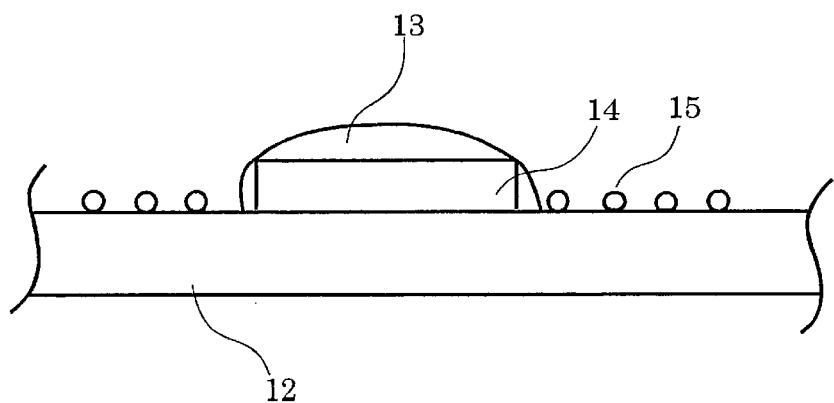
FIG. 4 shows a sectional view of a niobium thin film circuit device used in Examples and Comparative Examples and having a resist film which had been treated by etching.
Figure 5:
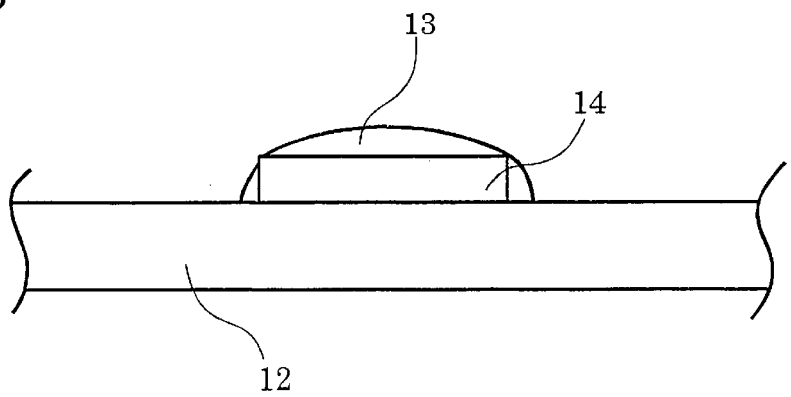
FIG. 5 shows a sectional view of a niobium thin film circuit device obtained by cleaning the thin film circuit device shown in FIG. 4.

A thin film of niobium was formed on a glass substrate in accordance with the sputtering. The formed film was coated with a photoresist and a pattern was formed with the photoresist in accordance with the lithography. Dry etching with a gas containing fluorine was conducted using the formed pattern of the photoresist as the mask. The sectional view of the obtained niobium thin film circuit device is shown in FIG. 4. In FIG. 4, the pattern of the photoresist 13 was present on the thin film of niobium 14 which was formed on the glass substrate 12. Residues of niobium such as fine particles of niobium 15 which were formed by the dry etching were scattered and remained on the glass substrate 12. The above niobium thin film circuit device was dipped into a cleaning agent having the composition shown in Table 3 in the conditions shown in Table 3, rinsed with ultra-pure water and dried. The sectional view of the tantalum thin film circuit device after being cleaned is shown in FIG. 5.

Then, the surface of the glass substrate 12 was examined by the scanning electron microscope (SEM) observation with respect to the removal of the fine particles of niobium and the result of the examination was evaluated in accordance with the above criterion in the same manner as that in Example 11. The results of the evaluation are shown in Table 3.

TABLE 3

| | Composition of cleaning agent | | | Condition of cleaning | | Removal of fine particles |
|---|---|---|---|---|---|---|
| | oxidizing agent (% by wt.) | chelating agent (% by wt.) | water (% by wt.) | temperature (° C.) | time (min.) | of niobium |
| Example 17 | HP (5) | PDTP (0.3) | 94.7 | 50 | 10 | excellent |
| Example 18 | HP (5) | DTPP (0.3) | 94.7 | 50 | 10 | excellent |
| Example 19 | HP (5) | EDBP (0.3) | 94.7 | 50 | 10 | excellent |
| Example 20 | HP (5) | EDTA (0.5) | 94.5 | 50 | 15 | excellent |
| Example 21 | HP (10) | PDTP (0.3) | 89.7 | 40 | 10 | excellent |
| Example 22 | HP (3) | PDTP (0.3) | 96.7 | 60 | 10 | excellent |
| Comparative Example 10 | HP (5) | — | 95.0 | 50 | 10 | fair |
| Comparative Example 11 | — | PDTP (0.3) | 99.7 | 50 | 10 | poor |
| Comparative Example 12 | — | DTPP (0.3) | 99.7 | 50 | 10 | poor |

HP Hydrogen peroxide
PDTP 1,2-Propanediaminetetramethylenephosphonic acid
DTPP Diethylenetriaminepentamethylenephosphonic acid
EDTA Ethylenediaminetetraacetic acid
EDTP Ethylenediaminetetrakismethylenephosphonic acid
EDBP Ethylenediaminebismethylenephosphonic acid.

COMPARATIVE EXAMPLE 13

A niobium thin film circuit device which was the same as that shown in FIG. 4 was cleaned with a cleaning liquid containing 60% by weight of monoethanolamine and 40% by weight of N-methylpyrrolidone at 80° C. for 10 minutes, rinsed with isopropanol and dried. The dried device was examined by the scanning electron microscope (SEM) observation and it was found that most of the fine particles of niobium 15 shown in FIG. 4 were left remaining.

EXAMPLE 23

A glass substrate was cleaned with a cleaning agent containing 5% by weight of hydrogen peroxide, 0.2% by weight of 1,2-propanediaminetetramethylenephosphonic acid and the rest of water at 30° C. for 15 minutes. After being rinsed and dried, the glass substrate was examined by the scanning electron microscope (SEM) observation and no damages or rough surfaces were found at all.

On the glass substrate cleaned above, a thin film of tantalum was formed to the thickness of 3,000 Å in accordance with the sputtering. A resin tape was adhered to the formed thin film and the peeling test of the thin film was conducted. The thin film of tantalum was not peeled at all.

COMPARATIVE EXAMPLE 14

A glass substrate was cleaned with a buffered aqueous solution of hydrofluoric acid at 23° C. for 15 minutes. After being rinsed and dried, the glass substrate was examined by the SEM observation and damages were clearly found on the surface of the glass substrate.

COMPARATIVE EXAMPLE 15

A glass substrate was cleaned with a 0.5% by weight aqueous solution of TMAH (tetramethylammonium hydroxide) at 23° C. for 15 minutes. After being rinsed and dried, the glass substrate was examined by the SEM observation and no rough surfaces were found at all.

On the glass substrate cleaned above, a thin film of tantalum was formed to the thickness of 3,000 Å in accordance with the sputtering. A resin tape was adhered to the formed thin film and the peeling test of the thin film was conducted. The thin film of tantalum was peeled at the entire portions of the surface and it was shown that the adhesion was poor.

EXAMPLE 24

In accordance with the same procedures as those conducted in Example 11, a thin film of tantalum was formed on a glass substrate in accordance with the sputtering. The formed film was coated with a photoresist and a pattern was formed with the photoresist in accordance with the lithography. Dry etching with a gas containing fluorine was conducted using the formed pattern of the photoresist as the mask and then ashing with oxygen plasma was conducted at 170° C. for 3 minutes. The above tantalum thin film circuit device was dipped into a cleaning agent having the same composition as that of the cleaning agent used in Example 11 at 50° C. for 10 minutes to remove tantalum residues formed by the dry etching, rinsed with ultra-pure water and dried. Subsequently, the surface of the glass substrate of the obtained tantalum thin film circuit device was examined by the scanning electron microscope (SEM) observation with respect to the removal of the fine particles of tantalum and the result of the examination was evaluated in accordance with the criterion described above. It was found that the tantalum residues such as the tantalum fine particles were completely removed.

INDUSTRIAL APPLICABILITY

Using the cleaning agent of the present invention, a photoresist film formed on an inorganic or plastic substrate, resist residues and resist residues remaining after ashing can be removed easily in a short time while wiring materials are not corroded at all.

Using the cleaning agent of the present invention, residues derived from conductive thin films which are formed by dry etching can be removed easily. The cleaning can be sufficiently conducted without corrosion of switching devices or wiring materials used for glass substrates and thin film circuit devices. Therefore, clean liquid crystal display panels of high qualities containing very little impurities can be obtained.

Moreover, the cleaning agent of the present invention can be used very effectively for cleaning glass substrates themselves. Glass substrates cleaned with this cleaning agent can be advantageously used as substrates for various liquid crystal display panels of high qualities.

What is claimed is:

1. A cleaning agent which consists essentially of 3 to 10% by weight of hydrogen peroxide and 0.2 to 1.5% by weight of a chelating agent, and which is a cleaning agent that removes photoresist film, resist residues and residues derived from conductive thin films, and cleans glass substrates of liquid crystal display panels, wherein said chelating agent is at least one compound selected from the group consisting of ethylenediaminetetrakismethylenephosphonic acid, diethylenetriaminepentamethylenephosphonic acid, 1,2-propanediaminetetramethylenephosphonic acid and ethylenediaminetetraacetic acid.

2. A cleaning agent according to claim 1, which is an aqueous solution of said hydrogen peroxide and said chelating agent.

3. A cleaning agent according to claim 1, wherein said chelating agent is at least one compound selected from the group consisting of ethylenediaminetetrakismethylenephosphonic acid, diethylenetriaminepentamethylenephosphonic acid, 1,2-propanediaminetetramethylenephosphonic acid.

4. A cleaning agent according to claim 1, wherein said chelating agent is ethylenediaminetetraacetic acid.

5. A cleaning agent according to claim 1, wherein said chelating agent is ethylenediaminetetrakismethylenephosphonic acid.

6. A cleaning agent according to claim 1, wherein said chelating agent is diethylenetriaminepentamethylenephosphonic acid.

7. A cleaning agent according to claim 1, wherein said chelating agent is 1,2-propanediaminetetramethylenephosphonic acid.

* * * * *